United States Patent [19]

Fischer et al.

[11] Patent Number: 5,126,698
[45] Date of Patent: Jun. 30, 1992

[54] PHASE MODULATOR OPERATED IN SATURATION AND WITH SMALL ANGLE MODULATION

[75] Inventors: Michael C. Fischer, Palo Alto; William E. Strasser, Montara, both of Calif.

[73] Assignee: Hewlett-Packard Company, Palo Alto, Calif.

[21] Appl. No.: 633,653

[22] Filed: Dec. 20, 1990

Related U.S. Application Data

[63] Continuation-in-part of Ser. No. 520,142, May 8, 1990, abandoned, which is a continuation of Ser. No. 360,499, Jun. 2, 1989, abandoned.

[51] Int. Cl.[5] .................... H03C 3/02; H04L 27/20
[52] U.S. Cl. .................... 332/105; 332/146; 375/52; 375/67; 455/42; 455/110
[58] Field of Search ........... 332/103, 105, 144, 146; 328/155; 307/241, 242, 243, 262; 333/100, 103, 109, 117–123, 139, 164; 375/52, 53, 54, 67; 455/42, 110

[56] References Cited

U.S. PATENT DOCUMENTS

| | | | |
|---|---|---|---|
| 3,686,588 | 8/1972 | Jackson et al. | 332/103 |
| 4,013,960 | 3/1977 | Godet | 375/67 X |
| 4,021,758 | 5/1977 | Standing | 332/105 |
| 4,056,792 | 11/1977 | Horwitz et al. | 333/103 X |
| 4,153,994 | 5/1979 | Ren | 333/103 X |
| 4,168,397 | 9/1979 | Bradley | 375/53 X |
| 4,205,282 | 5/1980 | Gipprich | 333/164 X |
| 4,549,152 | 10/1985 | Kumar | 332/144 |
| 4,736,170 | 4/1988 | Wu et al. | 332/103 |

Primary Examiner—Siegfried H. Grimm

[57] ABSTRACT

An input carrier signal is applied to two paths. The two paths are such that the phase difference between the output of the two paths is substantially 90°. At least one of the two paths responds to a modulating signal to select the polarity of the phase difference between the outputs of the two paths. The two paths are such that the phase angle between the output and input of the modulator is substantially independent of the amplitude of the modulating signal. In specific embodiments, one of the two paths includes a mixer or a quadrature hybrid with reflective diodes where the mixer or the diodes are operated in saturation. The outputs of the two paths are combined to provide a modulated carrier signal.

16 Claims, 7 Drawing Sheets

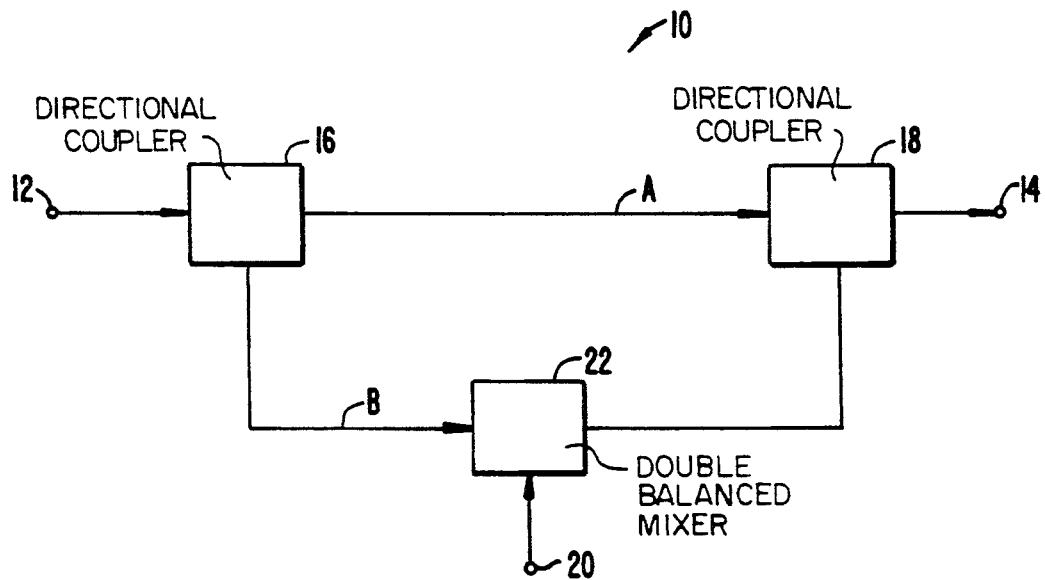
FIG._1A.
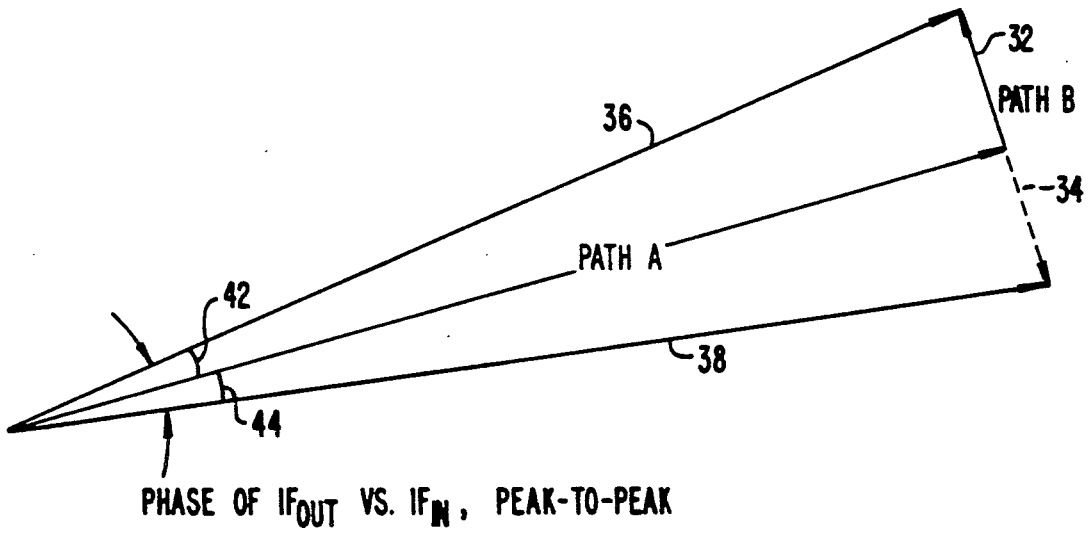
FIG._1B.

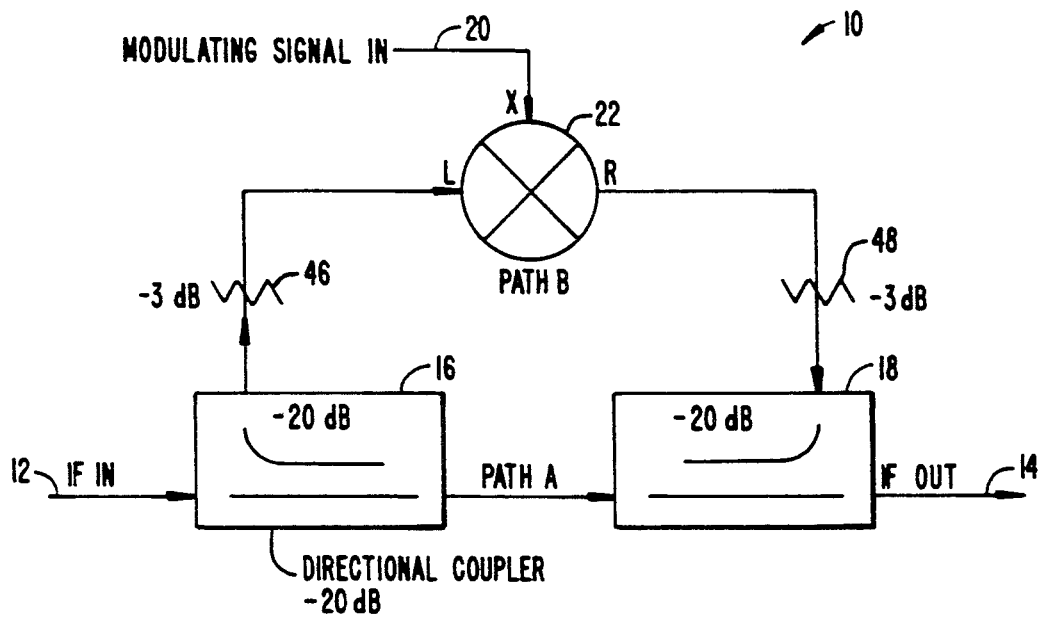
FIG._2
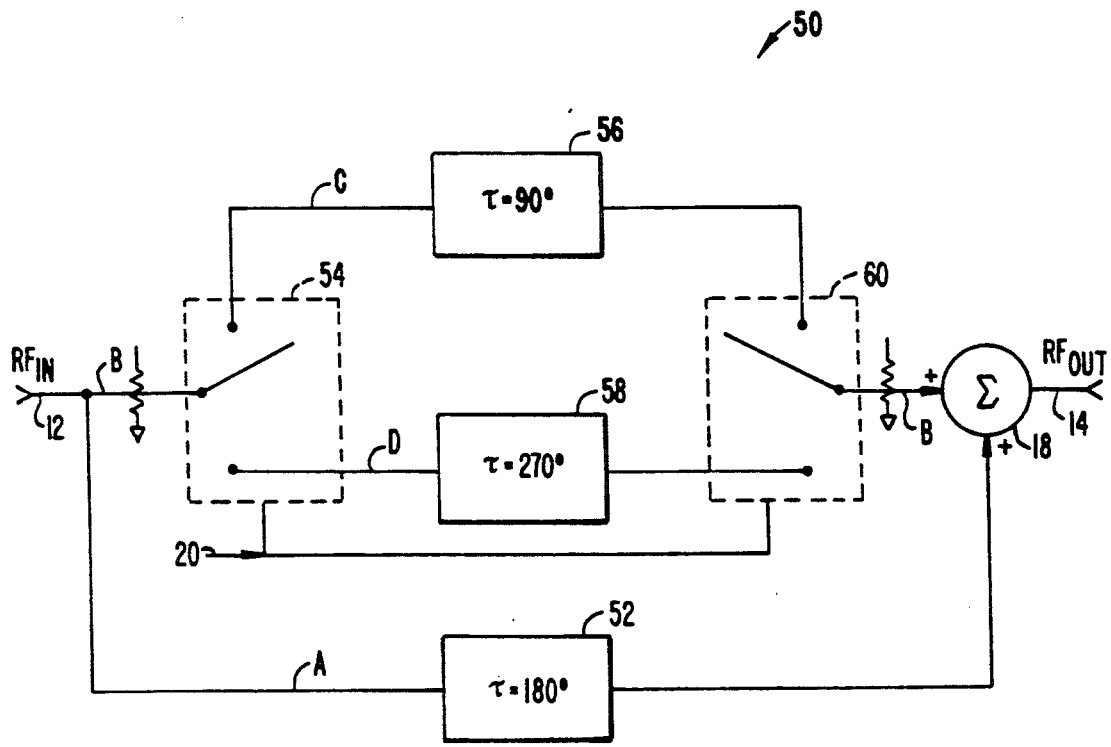
FIG._3A.

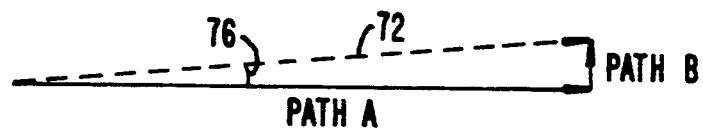
FIG._3B.
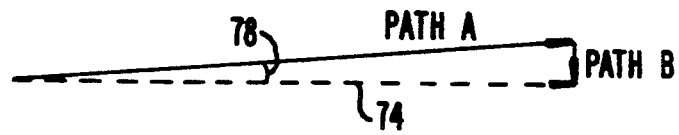
FIG._3C.
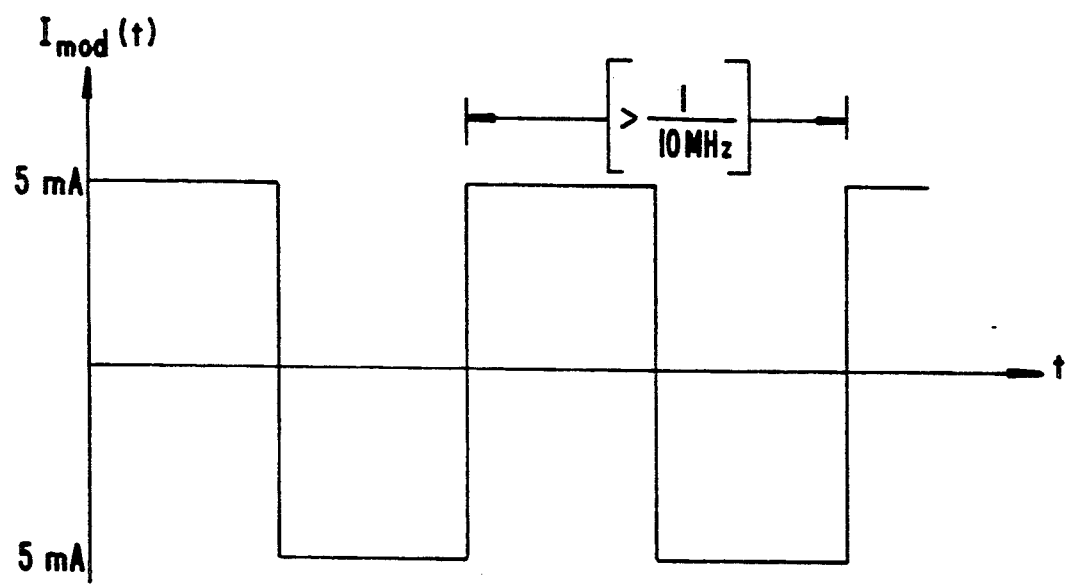
FIG._4.

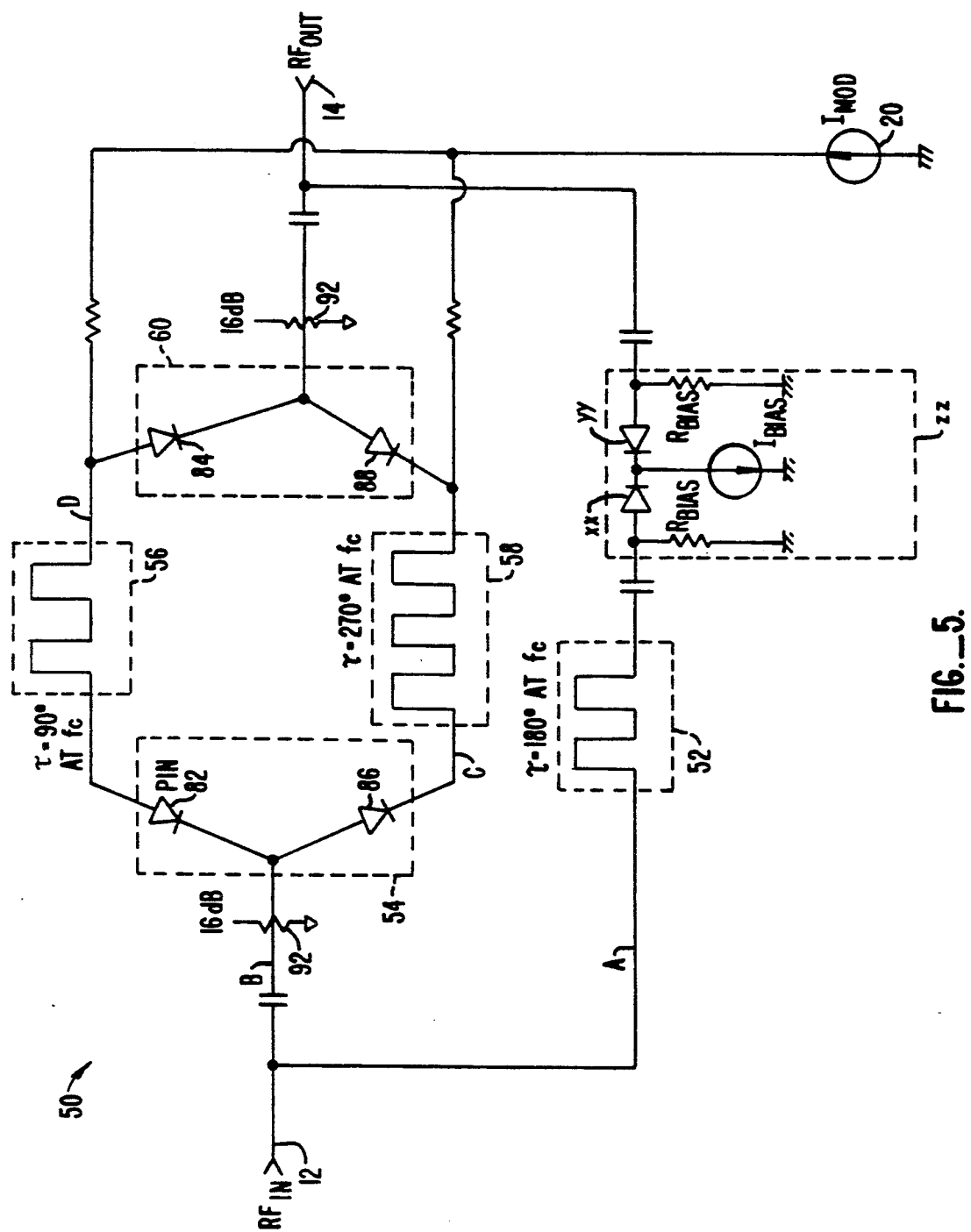
FIG._5.

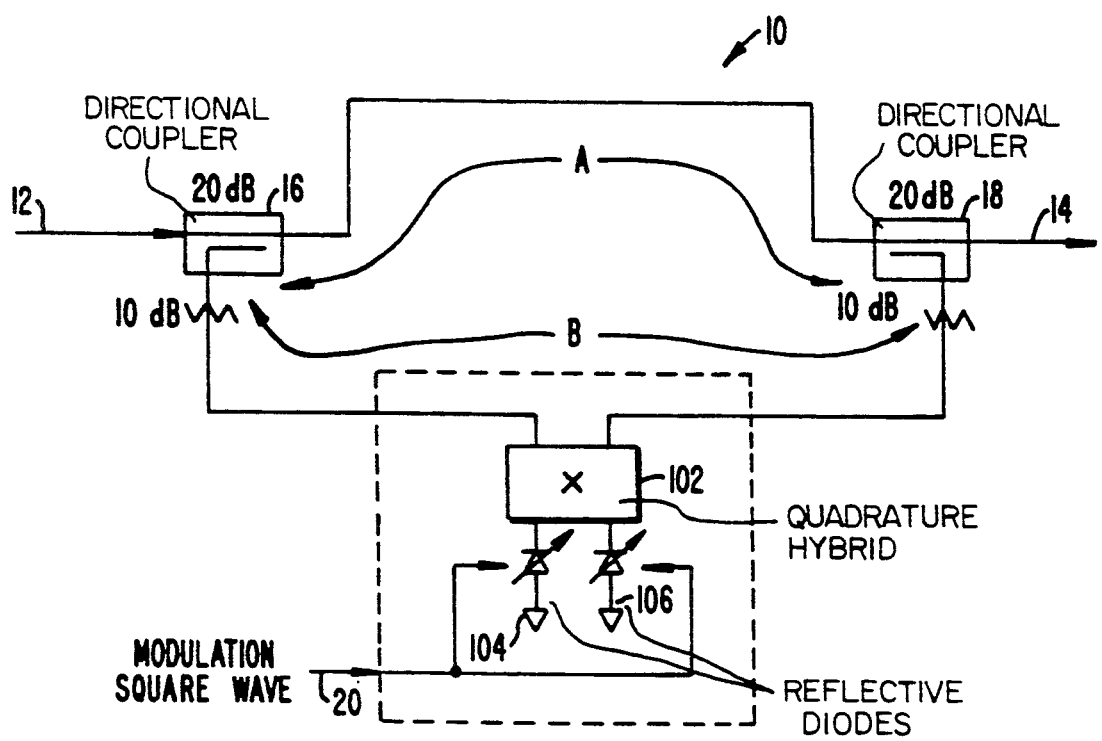
FIG._6.
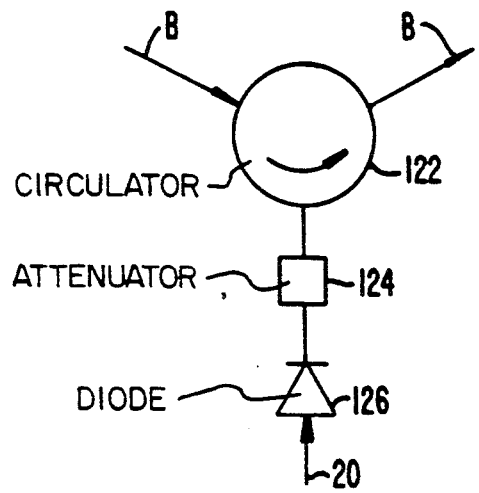
FIG._7.

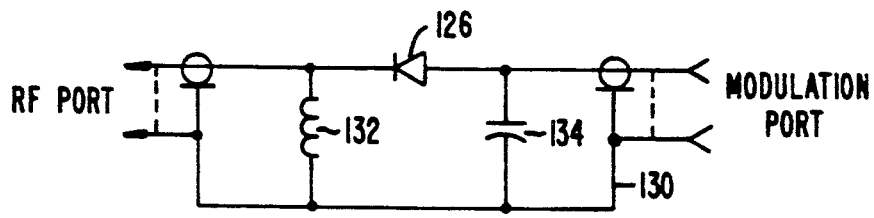
FIG._8.
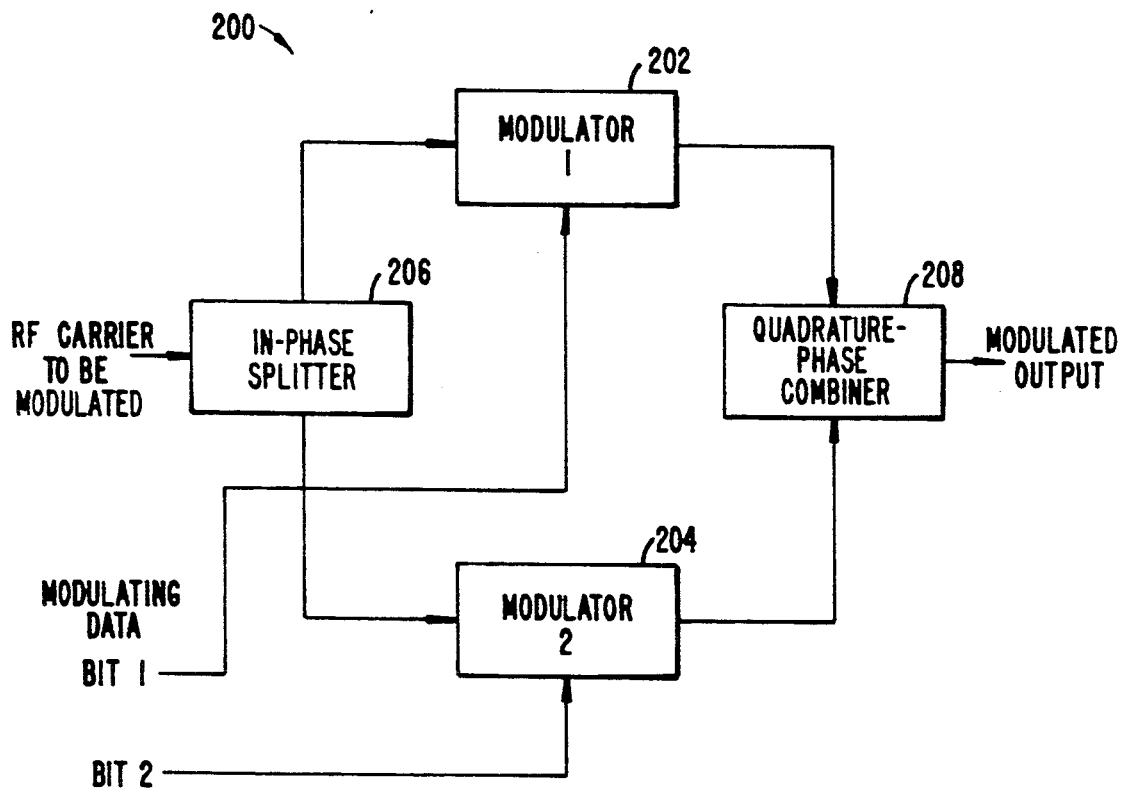
FIG._9.

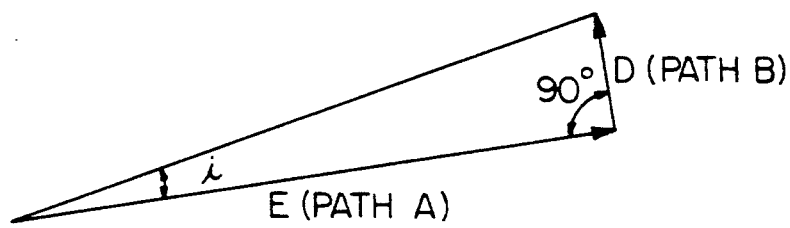
FIG_ 9A
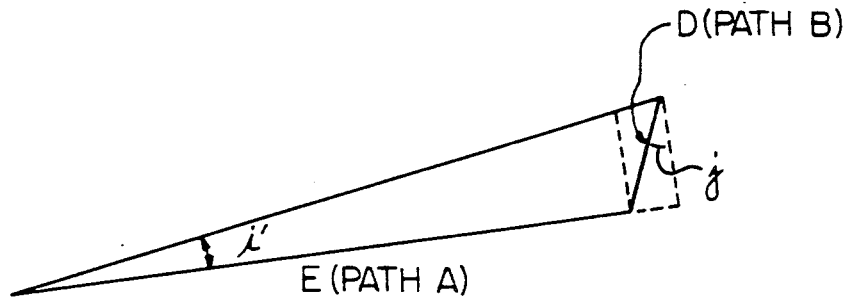
FIG_ 9B

1

PHASE MODULATOR OPERATED IN SATURATION AND WITH SMALL ANGLE MODULATION

CROSS REFERENCE TO RELATED APPLICATION

This application is a continuation-in-part of application Ser. No. 520,142, filed May 8, 1990, now abandoned which in turn was a continuation of application Ser. No. 360,499 filed Jun. 2, 1989, and now abandoned.

BACKGROUND OF THE INVENTION

The field of this invention relates in general to phase modulation and in particular to a phase modulator with improved accuracy and stability.

In many instruments, it is important to provide an accurate source of phase modulation which can serve as a calibration standard. In the paper "A Method of Reducing Disturbances in Radio Signaling by a System of Frequency Modulation", Proceedings of the Institute of Radio Engineers, Vol. 24, No. 5, pp. 689-740, May 1936, Armstrong disclosed a phase modulator for providing a source of phase modulation. The input RF power is split into two paths.

In one path, a product modulator is used to cause the modulating signal to vary the amplitude of the RF signal. A 20° phase changing device is employed in either one of the two paths. The outputs of the two paths are then summed to give the output of the phase modulator. The product modulation in the second path is performed with a more or less linear modulator so that the resulting sideband amplitudes are nearly proportional to the amplitude of the modulating signal.

Hence the sideband amplitudes in the output of the modulator are sensitive to changes in amplitude of the modulating signal or changes in the gain or linearity of the product modulator. It is therefore desirable to provide a phase modulator in which such disadvantages of the Armstrong phase modulator are overcome.

SUMMARY OF THE INVENTION

In the phase modulator disclosed by Armstrong, the product modulator in the second path is operated below saturation. For this reason, the resulting sideband amplitudes of the modulator output are sensitive to changes in the modulating signal or the transfer function of the product modulator caused by the environment or other factors.

This invention is based on the observation that, by operating the modulator so that the amplitudes and phase between the two paths are substantially independent of the amplitude of the modulating signal or the transfer function of the modulator, the phase modulation provided will remain the same despite changes in the modulating signal or changes in the modulator itself, whether induced thermally or by other factors.

The phase modulator of this invention is for providing a carrier signal which is phase shifted by an angle relative to an input signal. The modulator comprises a first and a second signal path for the input signal. The two paths are such that the phase difference between the outputs of the first and second paths is substantially 90 degrees. At least one of the two paths responds to a modulating signal for selecting the polarity of the phase difference.

The two paths are such that the amplitude of the phase angle is substantially independent of the amplitude of the modulating signal. The modulator also comprises means for splitting the input signal and applying the split input signal to the two paths and means for recombining the outputs of the two paths to provide a carrier signal.

At least one of the two paths includes a mixer which responds to the modulating signal for selecting the polarity of the phase shift. The mixer is operated in saturation so that the amplitude of the phase shift angle is substantially independent of the amplitude of the modulating signal.

In the preferred embodiment, the splitting means is such that the amplitude of the input signal in the path having the mixer is at least 10 dB to 100 dB lower than the amplitude of the input signal in the other path.

BRIEF DESCRIPTION OF THE DRAWINGS

FIG. 1A is a block diagram of a phase modulator to illustrate the invention.

FIG. 1B is a graphical illustration of the output of the phase modulator of FIG. 1A to illustrate the invention.

FIG. 2 is a block diagram of a phase modulator illustrating a first embodiment of the invention.

FIG. 3A is a block diagram of a phase modulator illustrating a second embodiment of the invention.

FIGS. 3B, 3C are graphical illustrations of the output of the modulator of FIG. 3A.

FIG. 4 is a graphical illustration of the signal waveform of a modulating signal to illustrate the invention.

FIG. 5 is a schematic view of a phase modulator illustrating the preferred embodiment of the invention.

FIG. 6 is a block diagram of a phase modulator illustrating a fourth embodiment of the invention.

FIG. 7 is a block diagram of a product modulator to replace the mixer of FIG. 2.

FIG. 8 is a schematic view of a diode holder.

FIG. 9 is a block diagram of a phase modulator whose output can provide more than two modulator states.

FIGS. 9A and 9B are graphical illustrations of the output of the modulators of the above figures to illustrate the effect of the amplitude of the phase shift between the outputs of the two paths on the accuracy and stability of the modulator.

DETAILED DESCRIPTION OF AN EXAMPLE CONSTRUCTION OF THE INVENTION

This detailed description is the best mode of practicing the invention; it is a specific and narrow example construction according to the invention. However, it is the claims that define the invention and establish its scope.

SYSTEM OVERVIEW

FIG. 1A is a block diagram of a phase modulator to illustrate the invention. As shown in FIG. 1A, phase modulator 10 modulates an input signal supplied to input 12, such as a RF carrier signal, and provides at output 14 a modulated carrier signal which is phase shifted relative to the input signal by a phase angle. Modulator 10 comprises block 16 for splitting the input signal along two paths A, B. The outputs of the two paths are combined by block 18 to yield the modulated carrier signal.

Paths A, B are such that the phase difference between the outputs of the two paths is substantially 90°, where at least one of the two paths responds to a modulating signal applied at node 20 for selecting the polarity of the phase difference. The two paths are such that the amplitude of the phase angle is substantially independent of the amplitude of the modulating signal. As shown in FIG. 1A, path B includes block 22 which responds to modulating signal 20 for selecting the polarity of the phase shift.

System Details

FIG. 1B is a graphical illustration of the relative phase shifts between paths A, B of FIG. 1A. As shown in FIG. 1A, path A simply passes the input signal. Path B is phase shifted 90° relative to path A as shown in FIG. 1B. The output of path B is substantially 90° phase shifted relative to the output of path A where the polarity of the output of path B may be selected in response to the modulating signal. Thus, the modulating signal may be chosen so as to select between one of two outputs for path B: output 32 or 34, as shown in FIG. 1B. Through this feature, modulator 10 provides an output at 14 selectable between two vectors 36, 38.

The phase angle between the output at 14 and the input at 12 can take on one of two possible values, angle 42 or angle 44, selectable in response to the modulating signal. The amplitude of the path B signals 32, 34 is substantially independent of the amplitude of the modulating signal. For this reason, the amplitudes of the phase angles 42, 44 remain substantially constant irrespective of changes in the modulating signal. The phase modulator described by Armstrong does not provide this feature. Hence modulator 10 provides a modulated carrier signal which is accurate and stable.

In Armstrong's modulator, however, the magnitude of the phase angle is proportional to the amplitude of the modulating signal. Therefore, the angular phase shift provided by Armstrong's modulator is affected by changes in the modulating signal as well as changes in the product modulator. Such difficulties are alleviated in modulator 10 of FIG. 1A.

FIG. 2 is a block diagram of one implementation of modulator 10 of FIG. 1A to illustrate a first embodiment of the invention.

As shown in FIG. 2, block 16 is a directional coupler with 20 dB attenuation and block 18 is also a directional coupler with 20 dB attenuation in the coupled path. Block 22 is a double balanced mixer which is operated in saturation. Since mixer 22 is operated in saturation, the amplitudes of the phase angles 42, 44 are not affected by changes in amplitude of the modulating signal 20 or changes in the transfer function of the mixer 22.

In Armstrong, the product modulator is operated below saturation so that the modulator is sensitive to changes in the modulating signal or the transfer function of the product modulator which is undesirable.

In contrast, since mixer 22 is operated in saturation, the modulation provided by modulator 10 is substantially unaffected by such factors. In the embodiment of FIG. 2, path B is longer than path A by such distance that the phase difference between the outputs of the two paths is substantially 90° at the frequency of the input signal at 12. Mixer 22 responds to the modulating signal 20 in selecting the polarity of the phase shift between the outputs of the two paths. In some applications, it is desirable to attenuate the signal in path B using attenuators 46, 48 as shown in FIG. 2.

FIG. 3A is a block diagram of a phase modulator 50 illustrating a second embodiment of the invention which is somewhat modified from modulator 10 of FIG. 1A. Identical components in FIGS. 1A, 3A are identified by the same numerals for simplicity.

As shown in FIG. 3A, the RF input signal at input 12 is split and applied to two paths A, B; in the claims, path B is referred to as the first path and part A is referred to as the second path. In contrast to the embodiment of FIG. 1A, a time delay 52 is applied to path A to delay the input signal by 180°. The signal in path B is split further into two branch paths C and D through a switch 54. A time delay 56 is applied to branch path C to delay the input signal by 90°; likewise, a delay 58 is applied to the input signal in branch path D to delay the input signal by 270°. Another switch 60 connects either branch path C or branch path D to path B and summer 18. Switches 54, 60 are controlled by the modulating signal 20.

Therefore, if the modulating signal causes switches 54, 60 to connect first path B to branch path C, the output signal of first path B will lead that of second path A by 90°. If however, the modulating signal causes the two switches to connect branch path D to first path B instead, the output of first path B will lag that of second path A by 90°. The outputs of paths A and B are summed by summer 18 to provide the RF output carrier signal at 14.

FIG. 4 shows that if the modulating signal is a square wave signal which causes the two switches to connect path C to path B at one value and path D to path B at the other value, the phase relationships between paths A and B and the vector representation of the modulated RF signal at 14 are shown in FIGS. 3B, 3C.

Thus, at time t0, when the modulating signal is at one value so that path D is connected to path B, the output of path A leads that of path B by 90° so that the vector representations of the outputs of the two paths are shown in FIG. 3B. In such event, the modulated RF signal at 14 is represented by the vector 72 in FIG. 3B. At time t1, the modulating signal 20 is at the other value, so that path C is connected to path B instead. In such event, path B leads path A by 90° so that the vector representation of the outputs of the two paths is illustrated in FIG. 3C.

In this case, the modulated RF output at 14 is represented by the vector 74 in FIG. 3C. The time delays 52, 56, 58 and the switches 54, 60 are such that they are substantially unaffected by changes in the modulating signal 20 so that the phase angles 76, 78 of FIGS. 3B, 3C are substantially unaffected by changes in the modulating signal at 20. One graphical illustration of a square wave modulating signal at 20 is illustrated at FIG. 4.

FIG. 5 is a schematic circuit diagram showing in more detail a particular implementation of the phase modulator 50 of FIG. 3A to illustrate the preferred embodiment of the invention.

As shown in FIG. 5, the time delays 52, 56, 58 are implemented simply by choosing suitable path lengths such that the suitable time delays are achieved substantially at the frequency of the input RF signal at 12. Switches 54, 60 are accomplished each by a pair of diodes arranged with their polarities as shown in FIG. 5.

Thus, when the modulating signal 20 is at a positive value such as at 5 milliamps as shown in FIG. 4, the pin diodes 82, 84 will be conducting and pin diodes 86, 88 will be non-conducting, thereby connecting path D to path B.

When the modulating signal at 20 is negative at −5 milliamps, first and second diodes 82, 84 will be turned off whereas third and fourth diodes 86 and 88 will be conducting, thereby connecting path C to path B instead. In such manner, the modulating signal causes switches 54, 60 to connect path D or path C to path B at alternate times. Where desired attenuators 92 may be applied to path B to achieve the desired phase shift angle at output 14.

Diodes 82, 84, 86, 88 are operated in saturation, so that the attenuation applied in paths B, C, D are substantially independent of the magnitude of the modulating signal 20. For this reason, the output of path B is substantially independent of the amplitude of the modulating signal so that the modulation provided by modulator 50 is also substantially independent of the magnitude of the modulating signal.

Fifth and sixth diodes XX, YY in block ZZ are also operated in saturation to track the temperature induced loss variance of diodes 82, 84, 86, 88. This maintains the relative amplitudes of second path A and first path B over temperature changes. The fifth and sixth diodes are coupled in series in second path A and separated by a node connected to a signal bias source.

FIG. 6 is a block diagram of a more detailed implementation of the modulator 10 of FIG. 1 to illustrate a fourth embodiment of the invention.

As shown in FIG. 6, blocks 16, 18 are directional couplers with 20dB attenuation. Paths A, B are substantially of the same length. Block 22 includes a quadrature hybrid 102 and two reflective diodes 104, 106. The modulating signal at 20 is applied to the diodes as shown. The value of the modulating square wave signal at 20 controls whether diodes 104, 106 are open or shut.

By controlling such state of the diodes, the quadrature hybrid and the diodes together causes the output of path B to lead the output of path A by 90° or to lag the output of path A by 90°, depending on which one of the two values the modulating signal is at. One suitable quadrature hybrid which may be used is Merrimac QHM-2-1.5 G or Merrimac QHF-2-1.5 GK. Diodes 104, 106 are operated in saturation so that the output of path B, and therefore the phase angle between the input and output of the modulator are substantially independent of changes in the amplitude of the modulating square wave signal at 20.

Since paths A, B in FIG. 6 are substantially of the same length and the phase shift introduced by the reflective diodes together with a quadrature hybrid is substantially independent of the frequency of the RF signal, the embodiment in FIG. 6 will perform as described above irrespective of the frequency of the RF signal. Thus, the implementation of FIG. 6 has the advantage that it is a broadband device, and is not limited to any particular carrier frequency. In this respect, it is more advantageous than the other embodiments described above.

FIG. 7 is a block diagram of a product modulator to illustrate in more detail one implementation of the mixer of FIG. 2.

As shown in FIG. 7, the mixer comprises a circulator 122, and attenuator 124 and a reflective diode 126. The state of the diode 126 is controlled by the modulating signal at 20. The modulating signal is preferably a square wave signal. When the modulating signal is of one value, it causes the signal reflected by diode 126 to be of one phase and when the modulating signal is of the other value it causes the signal reflected by diode 126 to be of the opposite phase (that is, 180° relative to the phase of the signal reflected in the other state).

In both FIGS. 6 and 7 the modulating signal is applied to the diode through a diode holder illustrated in FIG. 8. As shown in FIG. 8, the diode holder may simply be a coaxial structure 130 with two ports connected respectively to the anode and cathode of the diode 126 and having a shunting inductor 132 and a capacitor 134.

FIG. 9 is a block diagram of a phase modulator whose output can provide more than two modulator states.

As shown in FIG. 9, modulator 200 comprises a first modulator 202 and a second modulator 204, where each of the two modulators can be implemented in accordance to any of the embodiments described above. An RF carrier signal to be modulated is split by an in-phase splitter 206 and applied to the two modulators arranged in parallel. The output of modulator 202 will be a modulated signal having two states selectable by a modulating signal which may simply be a one bit digital signal. Modulator 204 also provides a modulated carrier signal having two states selectable by a separate and independent modulating signal, which may again be a one bit digital signal.

The output of the two modulators are combined by a quadrature-phase combiner 208 to provide a modulated output in which the outputs of the two modulators 202, 204 are combined in predetermined phase relationship. In the preferred embodiment, the outputs of the modulators 202, 204 are combined such that the phase difference between them is approximately 90°. Hence the modulated output of modulator 200 can be in any one of four states, selectable by the two modulating signals applied to modulators 202, 204.

It will be evident that more than two modulators may be employed in parallel as in the scheme of FIG. 9 to provide a modulated output selectable to be in any one of 6, 8, . . . states. All such possible implementations are within the scope of the invention. If modulators 202, 204 are implemented in the form of any one of the previously described embodiments, such modulators will also include in-phase signal splitters.

Thus, in some applications, it may be desirable to eliminate the signal splitters within the modulators 202, 204 and employ an in-phase splitter 206 which applies the split signal to four or more paths instead of two. Similarly, combiner 208 may be used to combine the outputs of four or more paths instead of two so that the combiners within modulators 202, 204 may be eliminated. All such variations are within the scope of the invention.

As known to those skilled in the art, phase errors in phase modulators are caused by a number of factors. Small changes in the amplitude of the modulator signal applied to the mixer will cause errors in the phase angle. This is illustrated with the help of FIG. 9A. As shown in FIG. 9A, the vector D represents the signal output of path B and E is the vector representation of the signal output of path A. Ideally, one signal would lead or lag the other by 90° in phase. The phase shift angle i is the angular phase shift provided by the modulator with the paths A, B. It is desirable that such angular phase shift remain stable and accurate over time and different temperatures, and where the modulator is implemented by different electronic components.

As discussed above, one source of error is caused by variations in the amplitude of the modulating signal. Such variations would cause a change in amplitude of the output signal of path B, or in the amplitude of the vector D. As is clear from FIG. 9A, changes in the amplitude of the vector D will cause changes in the phase shift angle i of the modulator. As also discussed above, by operating the mixers in path B in saturation, the signal output of path B is substantially insensitive to variations in the amplitude of the modulating signal. For this reason, the signal output of path B and therefore the amplitude of vector D, will remain substantially the same despite variations in the modulating signal amplitude.

Ideally, vector D should be at right angles to the vector E which means that the signal output of path B should lead or lag that of path A by exactly 90°. If the two vectors are not at right angles as illustrated in FIG. 9B, this will again introduce an error in the phase shift of the modulator. As shown in FIG. 9B, the vector D deviates from the 90° position from the vector E by an angle j. Therefore, the following equations apply:

$$\tan i' = \frac{D\cos j}{E + D\sin j}$$

$$i' = \arctan \frac{(D/E)\cos j}{1 + (D/E)\sin j}$$

Thus where the phase shift angle i' is small so that the vector E is much longer than vector D, the angle i' is approximately equal to $\tan^{-1}(D/E)$, a constant as discussed above. Therefore, Where vector E is much longer than vector D, errors in the quadrature angle also will not significantly affect the phase shift. It has been found that if the amplitude of the main path A signal is at least about 10 dB greater than that of the side path B signal, the phase shift is noticeably less affected by quadrature errors. Thus, another aspect of the invention is directed to a mixer including a splitting means for splitting the input signal into two paths so that the amplitude of the signal in one path is at least about 10 dB greater than that of the signal in the other path. In the preferred embodiment, the ratio of the amplitudes may be set to a value within a range of 10 to 100 dB, such as 20, 40 or 60 dB.

The apparatus and methods described above in specific example constructions are merely illustrative of the claimed invention. Various changes in the details of construction may be made that will still remain within the scope of the appended claims.

It is the claims that (a) define the invention and (b) establish the scope of the defined invention.

The invention defined and claimed is:

1. A phase modulator for providing a modulated carrier signal which is phase shifted by an angle relative to an input signal, comprising:
   (a) a first and a second signal path for the input signal:
      (i) the two paths being such that the phase difference between the outputs of the first and second paths is substantially 90°;
      (ii) wherein at least one of the two paths includes a mixer which responds to a modulating signal for selecting the polarity of the phase difference; and
      (iii) said mixer operating in saturation so that the amplitude of the angle is substantially independent of the amplitude of the modulating signal;
   (b) means for splitting the input signal and applying the split input signal to the two paths such that the amplitude of the input signal in said path having the mixer is at least 20 dB lower than the amplitude of the input signal in the other path; and
   (c) means for re-combining the outputs of the two paths forming a vector sum to provide a modulated carrier signal.

2. The modulator of claim 1, wherein
   a. the two paths have different path lengths; and
   b. wherein the difference in path lengths is such that the phase difference between the outputs of the two paths is substantially 90° at the frequency of the input signal.

3. The modulator of claim 2, wherein the mixer is a double-balanced mixer.

4. The phase modulator of claim 2, wherein the mixer comprises a circulator and a reflective diode.

5. The phase modulator of claim 4, wherein the diode is connected to the circulator and the modulation signal is applied to the diode by means of a diode holder.

6. The modulator of claim 1, wherein:
   a. the two paths have different time delays;
   b. the difference in the two time delays in such that the phase difference between the outputs of the two paths is substantially 90°; and
   c. the polarity of the phase difference is selected according to the value of the modulating signal.

7. The phase modulator of claim 1, wherein:
   (a) the mixer includes a quadrature hybrid and two reflective diodes operating either in cut-off or in saturation; and
   (b) alternately the diodes being responsive to the modulating signal for introducing a phase shift of substantially 90° or −90° in accordance with the value of the modulating signal, between the outputs of the two paths.

8. The modulator of claim 7, wherein the two paths are of substantially equal lengths.

9. The modulator of claim 7, wherein the diodes are connected to the quadrature hybrid and the modulating signal is applied to the diodes by means of diode holders.

10. The modulator of claim 1, wherein the splitting means is a directional coupler.

11. The modulator of claim 1, wherein the splitting means is a power splitter.

12. The modulator of claim 1, the modulator further comprising:
   a. at least a third and a fourth signal path for the input signal:
      i. the third and fourth paths being such that the phase difference between the outputs of the third and fourth paths is substantially 90°; and
      ii. wherein at least one of the third and fourth paths responds to a second modulating signal for selecting the polarity of the phase difference;
   b. means for splitting the input signal and applying the split input signal to the third and fourth paths; and
   c. means for re-combining the outputs of the third and fourth paths with the re-combined outputs of the first and second paths in predetermined phase relation to provide a modulated carrier signal with more than two states, wherein the amplitude of the angle is substantially independent of the amplitude of the modulating signal.

13. A phase modulator for providing a modulated carrier signal which is phase shifted by an angle relative to an input signal, comprising:
   (a) a first and a second signal path for the input signal:

(i) the two paths being such that the phase difference between the outputs of the first and second paths is substantially 90°;
(ii) wherein at least one of the two paths includes a mixer which responds to a modulating signal for selecting the polarity of the phase difference; and
(iii) said mixer operation in saturation so that the amplitude of the angle is substantially independent of the amplitude of the modulating signal;
(b) means for splitting the input signal and applying the split input signal to the two paths wherein the splitting means is such that the amplitude of the input signal in said path having the mixer is about 10 dB to 100 dB lower than the amplitude of the input signal in the other path; and
(c) means for re-combining the outputs of the two paths forming a vector sum to provide a modulated carrier signal.

14. A phase modulator for providing a modulated carrier signal which is phase shifted by an angle relative to an input signal, comprising:
(a) a first and a second signal path for the input signal:
(i) the two paths having different time delays such that the phase difference between the outputs of the first and second paths is substantially 90°;
(ii) wherein the first path includes a first and second branch, and wherein the first and second branch paths each includes two diodes and a node between the diodes, wherein a modulating signal is applied to the node of each path and wherein the diodes are of such polarities that when the modulating signal is at a first predetermined value, the first path is selected and the first but not the second branch path passes the input signal, and when the modulating signal is at a second predetermined value, the second path is selected and the second but not the first branch path passes the input signal;
(iii) said diodes operating in saturation or cutoff so that the amplitude of the angle is substantially independent of the amplitude of the modulating signal;
(iv) wherein the first and second branch paths include time delays; and
(v) wherein the time delays in the second path and in the first and second branch paths are such that:
(1) when the first branch path is selected, the output of the first path is substantially 90° in advance of the output of the second path; and
(2) when the second branch path is selected, the output of the first path is substantially 90° behind the output of the second path;
(b) means for splitting the input signal and applying the split input signal to the two signal paths such that the amplitude of the input signal in the first path having the two branch paths is at least 20 dB lower than the amplitude of the input signal in the second path; and
(c) means for re-combining the outputs of the two paths forming a vector sum to provide a modulated carrier signal.

15. The modulator of claim 14, wherein the time delays in the first path, comprised of the first branch path and second branch path, and in the second path, are caused by the different lengths of the three signal routes at a predetermined value of the frequency of the input signal.

16. The modulator of claim 14, wherein:
(a) the second path includes a fifth diode and a sixth diode, each having a saturating DC bias; and
(b) the diodes being coupled in series with respect to each other and with respect to the second path.

* * * * *